(12) United States Patent
Zhang et al.

(10) Patent No.: US 9,680,011 B2
(45) Date of Patent: Jun. 13, 2017

(54) SELF-ADJUSTED ISOLATION BIAS IN SEMICONDUCTOR DEVICES

(71) Applicant: Freescale Semiconductor, Inc., Austin, TX (US)

(72) Inventors: Zhihong Zhang, Chandler, AZ (US); Daniel J. Blomberg, Chandler, AZ (US); Xu Cheng, Chandler, AZ (US); Xin Lin, Phoenix, AZ (US); Hongning Yang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/926,500

(22) Filed: Oct. 29, 2015

(65) Prior Publication Data

US 2017/0125584 A1    May 4, 2017

(51) Int. Cl.

| | |
|---|---|
| *H01L 21/76* | (2006.01) |
| *H01L 29/78* | (2006.01) |
| *H01L 29/06* | (2006.01) |
| *H01L 29/10* | (2006.01) |
| *H01L 29/08* | (2006.01) |
| *H01L 21/265* | (2006.01) |
| *H01L 29/66* | (2006.01) |

(52) U.S. Cl.
CPC .... *H01L 29/7823* (2013.01); *H01L 21/26513* (2013.01); *H01L 21/76* (2013.01); *H01L 29/0634* (2013.01); *H01L 29/0642* (2013.01); *H01L 29/0882* (2013.01); *H01L 29/1095* (2013.01); *H01L 29/66681* (2013.01)

(58) Field of Classification Search
CPC ................. H01L 29/7823; H01L 21/26513
See application file for complete search history.

(56) References Cited

U.S. PATENT DOCUMENTS

| | | | |
|---|---|---|---|
| 6,882,023 B2 | 4/2005 | Khemka et al. | |
| 8,421,150 B2 * | 4/2013 | Huang | H01L 29/66659 257/335 |
| 8,541,862 B2 | 9/2013 | Yang et al. | |
| 2011/0180876 A1 * | 7/2011 | Laine | H03K 17/162 257/355 |

* cited by examiner

*Primary Examiner* — Fernando L. Toledo
*Assistant Examiner* — Valerie N Newton

(57) ABSTRACT

A device includes a semiconductor substrate, a doped isolation barrier disposed in the semiconductor substrate to isolate the device, a drain region disposed in the semiconductor substrate and to which a voltage is applied during operation, and a depleted well region disposed in the semiconductor substrate, and having a conductivity type in common with the doped isolation barrier and the drain region. The depleted well region is positioned between the doped isolation barrier and the drain region to electrically couple the doped isolation barrier and the drain region such that the doped isolation barrier is biased at a voltage level lower than the voltage applied to the drain region.

20 Claims, 3 Drawing Sheets

SELF-ADJUSTED ISOLATION BIAS IN SEMICONDUCTOR DEVICES

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
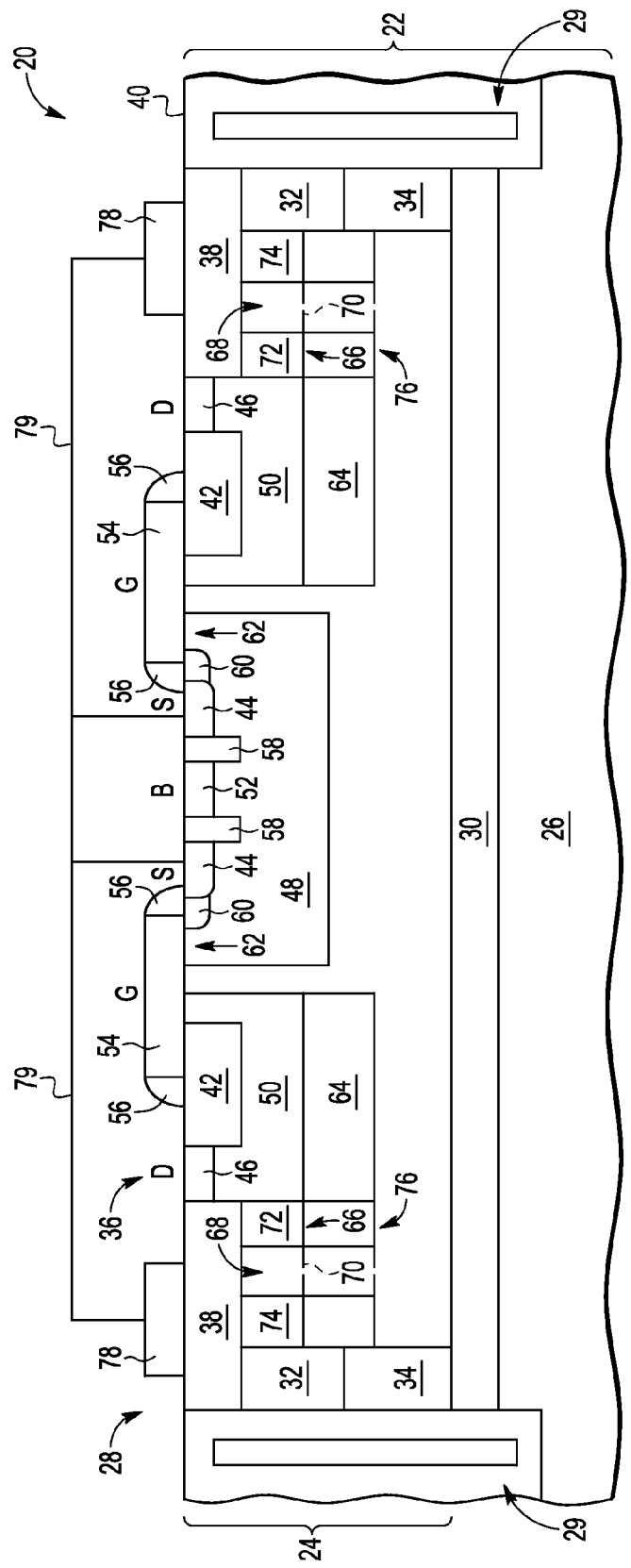
FIG. 1 is a cross-sectional, schematic view of an exemplary n-channel LDMOS (or NLDMOS) transistor with self-adjusted isolation bias in accordance with one embodiment.

Embodiments of laterally diffused metal oxide semiconductor (LDMOS) and other power transistor devices and electronic apparatus with self-adjusted isolation bias are described, along with methods of fabricating such devices. Isolation regions may be partially lifted to a bias voltage level using a well region that couples the isolation regions to a bias voltage applied to a drain region. The well region is positioned and otherwise configured to be depleted of charge carriers. As a result, some of the bias voltage applied to the drain region is sustained across the depleted well region. Only a portion of the bias voltage is therefore passed on to the isolation regions. The depleted well region thus provides partial biasing, or lifting of the isolation potential.

The self-adjustment and partial lifting of the isolation potential avoids biasing the isolation regions at voltage levels that would otherwise establish the breakdown voltage level of the device. With significantly less voltage stress between the device body and the isolation regions, much higher breakdown voltage levels (e.g., BVDSS levels) may be achieved.

The depleted well region is incorporated into a periphery of the device, rather than in the core device area. The peripheral location may be useful because, for large power devices, the size of the peripheral areas of the devices is relatively negligible. In addition, the depleted well region is connected with the drain through diffusion, instead of hard-wired by metal. As a result, the overall device size may decrease. Performance parameters related to device size, such as resistance, are thus not adversely affected.

The depleted well region also protects a deep trench isolation (DTI) region along the device periphery. Because the depleted well region partially biases the isolation regions adjacent the DTI region, additional breakdown protection for the DTI region is naturally provided without increasing device footprint.

The drain region may be positioned within the device core to facilitate the electrical coupling of the drain region and the isolation regions. In symmetrical and other layouts, the drain region is configured as an outer drain region that surrounds an inner device body (and source region). The outer drain-inner body/source arrangement allows the depleted well region to be placed between the isolation regions and the drain region. In some cases, the depleted well region is a lateral extension of the drift region surrounding the drain region. The same implant(s) used to form the drift region may be used to form both the depleted well region and the drift region.

Use of the depleted well region to couple the outer drain and isolation regions also eliminates the need for laterally spacing the device body from the isolation regions. In inner drain arrangements, the body region is spaced from the isolation regions by a portion of the epitaxial layer in which the transistor regions are formed, e.g., to sustain high voltage. That portion of the epitaxial layer is no longer necessary. In some cases, the width of the portion of the epitaxial layer is about 4 microns. The device footprint may thus remain approximately the same despite the incorporation of the depleted well region into the device periphery.

The device footprint may, in fact, be reduced. Area savings are realized by the absence of an isolation contact. The voltage of the isolation regions is instead established via the depleted well region. An isolation contact is no longer necessary. The lack of an isolation contact may be useful in connection with analog devices in which the device periphery constitutes a larger fraction of the total device footprint.

The depleted well region may be formed using an implant directed to forming a drift region of the device. Other regions may also be formed using available implants. For instance, a buried well region used to deplete the depleted well region may be configured to form a RESURF region used to deplete the drift region. Increases in fabrication costs may thus be avoided.

The outer drain arrangement for self-adjustment of the isolation potential is also useful in providing a wider process window during device fabrication. Problems that may otherwise arise from misalignment and variances in dopant concentration level are avoided. The outer drain arrangement provides more room for process error.

Adverse effects on device performance are also avoided. For instance, the self-adjustment of the isolation potential with outer drain arrangement does not reduce the overall size of the drain region. The ability of the drain region to collect secondary charge carriers is not hampered. The safe operating area (SOA) of the device is therefore not impacted. The size of the current path is also not reduced. The resistance of the drift region is also not impacted, insofar as the depleted well region is located in the device periphery. For these reasons, adverse impacts to the on-resistance (Rdson) of the device are avoided.

FIG. 1 is a schematic cross-sectional view of an example of an LDMOS device 20 constructed in accordance with one embodiment. In this embodiment, the device 20 is configured as an n-channel device. The device 20 may be configured as a RESURF transistor. In this example, the device 20 has a double RESURF arrangement.

The device 20 includes a semiconductor substrate 22, which may, in turn, include a number of epitaxial layers 24. In this example, the semiconductor substrate 22 includes a single p-type epitaxial layer 24 grown on an original, bulk substrate 26. The original substrate 26 may be a heavily doped p-type substrate in some cases, such as those having multiple epitaxial layers. The substrate 22 may be biased by a substrate contact region (not shown). The device 20 may alternatively or additionally include non-epitaxial layers in which one or more device regions are formed.

Any one or more of the layers of the semiconductor substrate 22 may include silicon. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. In this case, the device area 28 has two mirrored sides. For example, the device 20 may be laterally symmetrical about a central region, e.g., a body region, as described below. In other cases, the device 20 is also symmetrical in the other lateral direction. In still other cases, the device 20 is not laterally symmetrical. For example, the device area 20 may correspond with only one side of the device area 20 shown in FIG. 1.

The device area 28 may be defined by one or more device isolating layers or other regions in the semiconductor substrate 22 (e.g., the epitaxial layer 24). The regions may be or include doped semiconductor regions and/or undoped (e.g., dielectric) regions. In this example, the device area 28 is defined by a deep-trench isolation (DTI) ring 29. The structures in the device area 28 are laterally isolated from a remainder of the substrate 22 by the deep-trench isolation (DTI) ring 29.

A doped isolation barrier is provided for further isolation of the device 20. The doped isolation barrier may be disposed along the periphery of the device area 28. The doped isolation barrier may include a number of doped isolation layers and regions provided within the DTI ring 29 along the periphery of the device area 28. The layers and regions of the doped isolation barrier may laterally and/or otherwise surround the remainder of the device area 28 for further isolation of the device 20. For instance, the regions or layers of the doped isolation barrier may form an isolation tub in which the active components of the device 20 are disposed. The isolation tub includes a bottom and sidewalls extending upward from the bottom. In this example, the doped isolation barrier includes a buried isolation layer 30 that defines a bottom of the isolation tub. The doped isolation barrier also includes ring-shaped isolation wells 32, 34 that define sidewalls of the isolation tub. The isolation wells 32, 34 are stacked upon one another. The isolation well 34 is in contact with the buried isolation layer 30 to electrically connect the doped isolation barrier for the device 20. In other cases, a single well, or additional wells, may be used to define the sidewalls. In this example, with a p-type substrate, the regions and layers of the doped isolation barrier are n-type regions.

Within the doped isolation barrier is a core device area 36 of the device 20. The core device area 36 may correspond with the subset of the device area 28 in which the active components of the device 20 are disposed. In the symmetrical example of FIG. 1, the core device area 36 corresponds with the area extending from an outer terminal (e.g., a drain region as described below) inward. The buried isolation layer 30 extends across the entire lateral extent of the core device area 36. The lateral extent of the core device area 36 is defined in this example by an isolation region 38 disposed along a surface 40 of the substrate 22. The isolation region 38 extends laterally inward from the DTI region 29. In this case, the isolation region 38 is a shallow trench isolation (STI) region. The isolation region 38 may thus be ring-shaped to laterally surround the core device area 36.

The device 20 may include a number of other isolation regions (e.g., STI regions) to further define the active areas of the device 20. In this example, the device 20 includes a field isolation region 42 that establishes the length of the drift portion of the conduction path of the device. Additional or alternative isolation regions may be included. In other cases, the device 20 includes fewer isolation regions. For example, the device 20 may be configured with an active drift arrangement.

The buried isolation layer 30 may be formed in the semiconductor substrate 22 before the growth of the epitaxial layer 24 thereof. The buried n-type layer may thus extend laterally across and under the regions disposed, and later formed, in the core device area 36. The buried isolation layer 30 may alternatively or additionally assist in depletion of a drift region of the device 20 to support the RESURF effect, as described below.

One or more of the layers and regions of the doped isolation barrier may have a dopant concentration level and/or be otherwise configured for high voltage (HV) operation (e.g., high side operation in which the terminals of the device 20 are level shifted relative to the semiconductor substrate 22, which may be grounded). For example, the higher dopant concentration level of the isolation barrier layer may be useful in preventing punch-through. Any number of the device isolation wells, sinks, or buried layers may or may not be connected to one another. Additional, fewer, or alternative device isolation layers or regions may be provided in the semiconductor substrate 22.

Within the core device area 36, the device 20 includes a source region 44, a drain region 46, a body region 48 in which the source region 44 is disposed, and a drift region 50 in which the drain region 46 is disposed. In this example, the body region 48 is a p-type well formed in the epitaxial layer 24 of the substrate 22. The body region 48 may be biased via one or more heavily doped p-type body contact regions or electrodes 52 formed in or otherwise above the p-type well of the body region 48 in the semiconductor substrate 22. The dopant concentration of each contact region 52 may be at a level sufficient to establish an ohmic contact to the body region 48.

The source and drain regions 44 and 46 are laterally spaced from one another in the lateral dimension shown in the cross-section of FIG. 1. Any number of source or drain regions 44, 46 may be provided. In this example, the source and drain regions 44 and 46 are heavily doped n-type portions of the epitaxial layer 24. The heavily doped n-type source region 44 is disposed within, on, and/or otherwise above the body region 48. The heavily n-type doped drain region 46 is spaced from the body region 48 along the lateral dimension shown in FIG. 1. Such spacing defines a conduction path of the device between the source and drain regions 44 and 46. The regions 44, 46, or a portion thereof, may have a dopant concentration at a level sufficient to establish ohmic contacts for biasing the drain region 46 and the source region 44. In this n-channel LDMOS configuration, the drain region 46 is biased at a drain-source voltage, Vds, relative to the source region 44.

The device 20 includes one or more gate structures 54 formed on or above the surface 40 of the semiconductor substrate 22. In the example of FIG. 1, the device 20 may include a pair of gate structures 54, or a single ring-shaped gate structure 54. The gate structure 54 is disposed between the source region 44 and the drain region 46. The gate structure 54 includes a polysilicon or other conductive plate located on or above a gate dielectric. For example, the gate dielectric may include silicon dioxide (or oxide) deposited or otherwise formed on the surface 40.

The gate structure 54 may include one or more dielectric sidewall spacers 56 disposed along lateral edges of the gate structure 54. The sidewall spacers 56 may cover the lateral edges to act as a silicide blocker to prevent a silicide short along the surface of the substrate 22. The sidewall spacers 56 may provide spacing to separate the conductive components of the gate structure 54 from the source region 44 and other regions or structures within the core device area 36. In this example, one of the sidewall spacers 56 is used for alignment purposes in defining an edge of the source region 44.

In the example of FIG. 1, the device 20 is laterally symmetrical about the body region 48. The body region 48 (e.g., the body contact region 52) may be centered or otherwise internally disposed within the core device area 36. In this case, the drain and drift regions 46, 50 are ring-shaped regions that laterally surround the source and body regions 44, 48. The gate structure 54 may thus also surround the source and body regions 44, 48. In other cases, the device 20 may include a pair of drain regions 46 disposed on either side of the body region 48. In still other cases, the body region 48 may not be centered or otherwise disposed inward of, or laterally surrounded by, the drain region 46 as shown. For example, in non-symmetrical layouts, the drain region 46 is not ring-shaped.

The configuration of the gate structure 54 may vary. For example, the gate structure 54 may be arranged in a dual gate finger configuration in which two transistors are symmetrically arranged to share the same body region 48. The configuration of the gate structure 54 may include multiple conductive layers (e.g., polysilicon plates). The components, materials, and other characteristics of the gate structure 54 may vary from the example shown.

The STI region(s) 42 are disposed between the gate structure 54 and the drain region 46 to protect the gate structure 54 from the high voltage applied to the drain region 46. For example, the STI region 42 may be configured to prevent or minimize hot carrier injection (HCI) into the oxide layer of the gate structure 54. The STI region 42 is disposed in the drift region 50 to form a field drift structure. The other STI region(s) 38 define active areas along the periphery of the core device area 36.

A number of other shallow trench isolation (STI) regions may be formed at the surface 40 in the semiconductor substrate 22. In this embodiment, STI regions 58 are disposed between the body contact region 52 and the source region 44. Additional, fewer, or alternative STI regions may be disposed in the semiconductor substrate 22 to isolate or separate various contact regions, as well as other regions within the device area 28 of the device 20.

The conduction path of the device 20 may be configured with one or more lightly or intermediately doped transition regions 60 (e.g., n-type lightly doped drain, or NLDD, regions) at or near the source and drain regions 44 and 46. Each transition region 60 may be or include a diffused region formed in connection with the source or drain region 44, 46. Such transition regions may couple the source region 44 to a channel region 62 (described below). In this example, the device 20 includes an NLDD region 60 adjacent the source region 44. The NLDD region 60 may extend laterally under the gate structure 54 as shown.

When the gate structure 54 is biased, charge carriers (in this case, electrons; alternatively, holes) accumulate in one or more channel areas or regions 62. Each channel region 62 (or a portion thereof) may be formed in the body region 48 under the gate structure 54. In this example, the accumulation of electrons results in a charge inversion in the channel region 62 from the p-type of the body region 48 to an n-type conduction layer or area near the surface 40 of the semiconductor substrate 22. Once a sufficient amount of the charge carriers accumulate in the conduction layer or area, charge carriers are capable of flowing from the source region 44 toward the drain region 46 through the channel region 62.

The channel region 62 may include other regions or areas in the semiconductor substrate 22 in which charge inversion or accumulation occurs as a result of the bias applied to the gate structure 54. Charge carriers may also accumulate outside of or beyond the body region 48. For example, charge carriers may accumulate in a region of the epitaxial layer 24 between the body region 48 and the drift region 50, as well as in an accumulation region or portion of the drift region 50 near the surface 40 under the gate structure 54.

After exiting the channel region 62, the charge carriers drift through the drift region 50 to reach the drain region 46. The drift region 50 electrically couples the drain region 46 and the channel region 62. The drift region 50 may be configured to allow the charge carriers to drift under the electric field established by the drain-source voltage applied between the drain region 46 and the source region 44. In this example, the drift region 50 is an n-type well that laterally extends under the STI region 42 as a field drift region.

The drift region 50 may be configured to be depleted to reduce the magnitude of the electric field in areas in and/or around the drift region 50 via the reduced surface field (RESURF) effect to increase the voltage at which breakdown occurs along the conduction path of the device 20. In this example, the drift region 50 is depleted both laterally and vertically. A junction forms between the n-type well of the drift region 50 and the p-type epitaxial layer 24 and/or the body region 48 to establish a lateral RESURF effect. The junction is reverse-biased as a result of the application of a bias voltage Vds applied to the drain region 46, e.g., between the source region 44 and the drain region 46. The drift region 50 is also depleted vertically by a p-type buried well region 64 disposed under the drift region 50. The depletion of drift region 50 allows a portion of the voltage differential of the bias voltage to be disposed across the drift region 50, thereby lowering the likelihood of breakdown and/or other problems near the channel region 62.

Protection against breakdown at or near the periphery of the device area 28 is provided through biasing of the doped isolation barrier. Biasing the doped isolation barrier helps to isolate the device 20 from the remainder of the substrate 22. However, the buried isolation layer 30 and other components of the doped isolation barrier are biased at a voltage level lower than the drain-source bias voltage. The full drain-source bias voltage is not directly applied to the doped isolation barrier. Instead, the potential of the doped isolation barrier is instead partially lifted to the voltage level of the drain-source bias voltage to lower the voltage stress between the body region 48 and the doped isolation barrier (e.g., the buried isolation layer 30).

Such partial biasing of the doped isolation barrier is provided by a depleted well region 66 disposed in the semiconductor substrate 22 outside of the core device area 36. The depleted well region 66 electrically couples the drain region 46 and the doped isolation barrier. Because the depleted well region 66 is depleted of charge carriers, a voltage drop develops across the depleted well region. The voltage drop biases the doped isolation barrier at a voltage level lower than the voltage applied to the drain region. Thus, a portion of the drain-source bias voltage is supported by the depleted well region 66, such that only part of the bias voltage reaches the doped isolation barrier. The doped isolation barrier is thus not electrically tied to the drain region 46. The doped isolation barrier is instead biased at a voltage level lower than the voltage applied to the drain region 46.

In this example, the depleted well region 66 is an n-type well that extends between, and is in contact with, the drift region 50 and the isolation well 32 of the doped isolation barrier. In other embodiments, the depleted well region 66 may be laterally adjacent to additional and/or alternative regions or layers of the doped isolation barrier.

The depleted well region 66 may be formed in conjunction with the drift region 50. In some cases, the drift region 50 and the depleted well region 66 constitute contiguous or other portions of a single well in the epitaxial layer 24 of the substrate 22. In the example of FIG. 1, the drift region 50 may correspond with the portion of the single well through which charge carriers drift to reach the drain region 46 (e.g., after exiting the channel region 62). The drift region 50 may thus extend outward to the outer lateral boundary of the drain region 46. The depleted well region 66 may extend outward from the outer boundary of the drift region portion to reach the doped isolation barrier. Other contiguous and non-contiguous arrangements of the drift region 50 and the depleted well region 66 may be used. For example, the well (or other region) that includes the drift region 50 and the depleted well region 66 may be a composite region having different dopant concentration profiles arising from multiple implants.

The single well may be formed by a single implant or multiple implants. In either case, the single well arrangement establishes a common dopant concentration profile for the drift region 50 and the depleted well region 66. The same implant or implants are used to form the drift region 50 and the depleted well region 66. The regions 50, 66 (or at least portions thereof) may thus have the same dopant concentration profile. FIG. 1 depicts an example in which one or more portions of the depleted well region 66 have the same dopant concentration profile as the drift region 50. In this example, exterior portions of the depleted well region 66 have the same dopant concentration profile as the drift region 50, as described below.

The extent of the voltage drop across the depleted well region 66 may vary in accordance with the extent to which the depleted well region 66 is depleted of charge carriers. The depleted well region 66 may be partially or fully depleted of charge carriers. The extent to which the depleted well region 66 is depleted of charge carriers may be enhanced by one or more regions, structures, and/or other characteristics of the periphery of the device area 28. The extent of the depletion may be enhanced both laterally and/or vertically, examples of which are described below.

In the embodiment of FIG. 1, the lateral depletion of the depleted well region 66 is enhanced through one or more gaps in the dopant implantation area for the depleted well region 66. The lateral extent of the depleted well region 66 is shown both before and after thermal diffusion (e.g., one or more post-implant dopant drives). Before thermal diffusion, the depleted well region 66 has an interior gap 68. Thermal diffusion of the dopant of the depleted well region 66 then fills in the gap 68.

The diffusion lowers the dopant concentration level within an interior section or portion of the depleted well region 66. As a result, the depleted well region 66 has a more lightly doped interior section 70 that roughly corresponds with the location of the gap 68. The interior section 70 has a lower dopant concentration level than a pair of exterior sections that roughly correspond with exterior areas 72, 74 in which the implanted dopant resides before diffusion. The exterior areas 72, 74 are adjacent the isolation well 32 of the doped isolation barrier and the drift region 50, respectively. The exterior sections of the depleted well region 66 are far enough away from the gap 68 to not lose an appreciable amount of dopant to diffusion. The exterior sections may thus retain the same dopant concentration profile as the drift region 50. The lower dopant concentration level allows the interior section 70 to be more easily depleted of charge carriers, despite being farther away from a reverse-biased junction. As a result, a greater amount or degree of depletion of the depleted well region 66 may thus be achieved.

The location of the gap 68 may vary. For instance, the gap 68 may be disposed in an interior location closer to the isolation well 32. Generally, the interior location of the gap 68 may be useful in connection with possible mask misalignment. The interior location allows the masks for the implantation and the formation of the STI region 38 to be misaligned, and still provide the same, full effect of the gap 68. The width of the gap 68 may also vary, including widths that approach or reach zero.

Accordingly, in some cases, no gap is present in the dopant implantation area for the depleted well region 66. Despite the lack of the gap, the depleted well region 66 may nonetheless be sufficiently depleted during operation to provide the partial biasing. For instance, the dopant concentration level of the depleted well region 66 (and the drift region 50) may be light enough for depletion. Such depletion may be enhanced for other reasons, as described below. A single, continuous dopant implantation area may thus be used to form the depleted well region 66 and the drift region 50.

Depletion is accomplished in the vertical direction in the example of FIG. 1 through the presence of a p-type buried well region 76. The buried well region 76 is disposed under and in contact with the depleted well region 66. The buried well region 76 has the opposite conductivity type (e.g., p-type) than the depleted well region 66 for depletion of the depleted well region 66 along the lower boundary thereof.

The buried well region 76 may be formed via an implant (e.g., a p-type implant) that relies on the same mask as the implant (e.g., an n-type implant) used to form the drift region 50 and the depleted well region 66. The buried well region 76 may thus have a layout that corresponds with the depleted well region 66, including an interior gap that corresponds with the gap 68. The buried well regions 64, 76 may thus constitute portions of a single well. The depleted well region 66 may be thus be depleted from below in a manner similar to the way in which the drift region 50 is depleted by the buried well region 64.

The implant used to form the buried well region 76 may also counter-dope the region in which the depleted well region 66 is formed. For instance, the ion energy of the implant may be set such that the p-type dopant for the buried well region 76 reaches a greater depth than the n-type dopant for the depleted well region 66, but nonetheless is also present at the depths of the depleted well region 66. Such counter-doping of the depleted well region 66 leads to greater depletion of the depleted well region 66 both vertically and laterally.

Depletion in the vertical direction is also enhanced via a conductive flap 78 supported by the substrate 22 and positioned over the depleted well region 66. The conductive flap 78 is biased during operation to deplete the depleted well region 66. In this n-channel example, the conductive flap 78 may be biased at the voltage level of the source region 44 via an interconnect 79, as shown in FIG. 1, or at another low voltage level relative to the drain-source bias voltage. As a result, the charge carriers (in this case, electrons) are pushed away from the surface 40 of the substrate 22, thereby depleting the depleted well region 66 from above.

The thickness of the STI region 38 may be selected to achieve a desired amount of depletion. For example, the STI region 38 may have a thickness that falls in a range from about 0.1 µm to about 0.5 µm. The thickness may be selected such that the STI region 38 still provides a suitable amount of protection for the gate structure 54, e.g., to avoid hot carrier injection into the gate dielectric material.

The conductive flap 78 may also shield the depleted well region 66 from other voltages present above the surface 40 of the substrate 22. One or more metal layers may include interconnects disposed above the depleted well region 66. The conductive flap 78 may laterally extend across the surface 40 to an extent to shield the depleted well region 66 from the voltages carried on those interconnects. For instance, the conductive flap 78 may have a layout that matches or exceeds the layout of the interconnects.

The conductive flap 78 may include a polysilicon plate, one or more metal layers, or another conductive structure. The conductive flap 78 may be spaced from the surface 40 of the substrate 22 by one or more passivation layers. The conductive flap 78 may also be surrounded by one or more passivation structures. Any one or more dielectric materials may be used for the passivation layer(s) and/or structures.

The formation of the above-described regions involved in the partial biasing of the doped isolation barrier may not increase the complexity or cost of fabricating the device 20. For instance, and as described below in connection with the exemplary fabrication process shown in FIG. 3, the same implant(s) may be used to form the depleted well region 66 and the drift region 50. The same implant may be used to form the buried well region 64 and the buried well region 76. The buried well regions 64, 76 may thus have a common dopant concentration profile. Furthermore, in the example of FIG. 1, the n-type and p-type implants used to form these regions may be configured with the same mask, insofar as the layout of the n-type and p-type regions may be the same.

The presence of the depleted well region 66 and the buried well region 76 into the periphery of the device area 28 may not result in any increase in device footprint. The periphery of the device area 28 corresponds with the portion of the device area 28 outside of the core device area 36. The size of the periphery may not increase because the depleted well region 66 and the buried well region 76 effectively replace the spacing that would otherwise be present to laterally separate the body region from the doped isolation barrier in an inner drain/outer source arrangement.

The outer drain arrangement of the device 20 may instead enable area savings to be realized. As shown in FIG. 1, the outer location of the drain region 46 allows the depleted well region 66 to electrically couple the drain region 46 and the doped isolation barrier without having to rely on another contact to provide a voltage to the doped isolation barrier. For instance, the device 20 does not include an isolation contact or isolation contact region. Moreover, the resulting area savings may be significant for some types of devices, such as analog devices, for which the device periphery constitutes a considerable fraction of the total device area 28.

Figure 2:
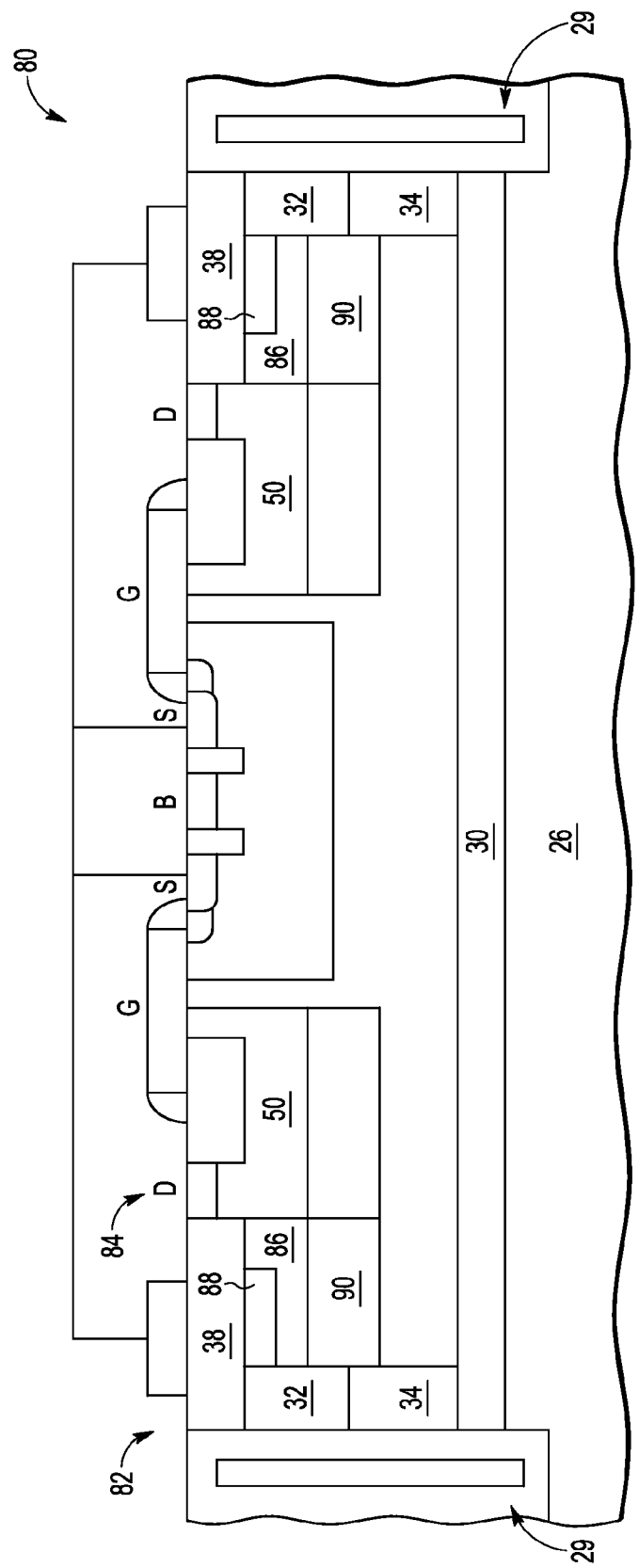
FIG. 2 is a cross-sectional, schematic view of another exemplary n-channel LDMOS transistor with self-adjusted isolation bias in accordance with one embodiment.

FIG. 2 depicts a device 80 having a partially biased isolation in accordance with one embodiment. The device 80 is configured similarly in many respects to the examples described above in connection with FIG. 1. For instance, the device 80 has a device area 82 defined by DTI region 29 and a doped isolation barrier having buried isolation layer 30 and isolation wells 32, 34. All of the regions and structures within a core device area 84 of the device 80 may be disposed, arranged, and otherwise configured as described above in connection with FIG. 1, including, for instance, the outer drain/inner source/body arrangement. Unless noted otherwise, the structures, components, and other elements of the device 80 may be configured as described above in connection with FIG. 1.

The device 80 differs from the above-described examples in the device periphery, i.e., the portion of the device area 82 outside of the core device area 84. A depleted well region 86 is again provided in the device periphery to bias the doped isolation barrier. But in this case, the depleted well region 86 has a floating pocket well region 88 disposed therein. The floating pocket well region 88 has the opposite conductivity type (e.g., p-type) than the depleted well region 86 to enhance the depletion of the depleted well region 86.

The floating pocket well region 88 may be positioned to deplete the depleted well region 86 from within. For example, the floating pocket well region 88 may be disposed at or near an outer and upper corner of the depleted well region 86. In this example, the floating pocket well region 88 is disposed at, and is contiguous with, an inner boundary of the isolation well 32. The floating pocket well region 88 may also be in contact with, and extend downward from, STI region 38.

The lateral and vertical positioning of the floating pocket well region 88 may vary from the example shown. For instance, the floating pocket well region 88 may be spaced from the boundary with the isolation well 32. The floating pocket well region 88 may be shifted to any amount or extent toward drift region 50. Along the vertical direction, the floating pocket well region 88 may be spaced from the STI region 38.

The relative size of the floating well region 88 may also vary from the example shown. For instance, the extent to which the floating pocket well region 88 extends through the depth of the depleted well region 86 may vary. In some cases, the floating well region 88 occupies approximately half of the depth of the depleted well region 86. The floating well region 88 may be either thicker or thinner. For example, the floating well region 88 may have a thickness that falls in a range from about 0.1 µm to about 0.7 µm in cases in which the depleted well region 86 has a thickness that falls in a range from about 0.5 µm to about 1.5 µm.

In the example of FIG. 2, there is no gap in either the pre-diffusion layout of the depleted well region 86 or a buried well region 90 adjacent thereto. The presence of the floating pocket well region 88 may be sufficient to deplete the depleted well region 86 to a desired extent. In other cases, the depletion may be enhanced through a combination of a floating pocket well region and an interior gap in the implant.

The depleted well region 86 and the buried well region 90 may be otherwise configured and formed as described above in connection with FIG. 1. For instance, the depleted well region 86 may be in contact and contiguous with the drift region 50. The same implant(s) may be used to form the depleted well region 86 and the drift region. The depleted well region 86 and the drift region 50 may thus have the same dopant concentration profile.

The above-described devices are shown in simplified form. For example, while FIGS. 1 and 2 may schematically depict an Ohmic metal layer and metal-one layer used to form various electrodes, FIGS. 1 and 2 do not show a number of other metal layers configured for interconnections with the electrodes. The devices may have a number of other structures or components for connectivity, isolation, passivation, and other purposes not shown in FIGS. 1 and 2 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
|---|---|---|
| p-epi 24: | $1 \times 10^{13}$-$5 \times 10^{15}$/cm$^3$ | 2-10 µm |
| substrate 26: | $1 \times 10^{15}$-$1 \times 10^{18}$/cm$^3$ | not applicable |
| buried layer 30: | $1 \times 10^{16}$-$5 \times 10^{19}$/cm$^3$ | 0.5-3.5 µm |
| well 32: | $1 \times 10^{16}$-$1 \times 10^{18}$/cm$^3$ | 1-2.5 µm |
| well 34: | $1 \times 10^{16}$-$1 \times 10^{18}$/cm$^3$ | 1-2.5 µm |
| body 48: | $1 \times 10^{16}$-$1 \times 10^{18}$/cm$^3$ | 0.5-2.5 µm |
| source 44: | $1 \times 10^{29}$-$5 \times 10^{21}$/cm$^3$ | 0.15-0.35 µm |
| drain 46: | $1 \times 10^{20}$-$5 \times 10^{21}$/cm$^3$ | 0.15-0.35 µm |
| reg. 50, 66, 86: | $5 \times 10^{15}$-$5 \times 10^{17}$/cm$^3$ | 0.5-1.5 µm |
| NLDD 60: | $1 \times 10^{17}$-$1 \times 10^{19}$/cm$^3$ | 0.2-0.3 µm |
| reg. 64, 76, 90: | $1 \times 10^{15}$-$1 \times 10^{17}$/cm$^3$ | 1-2.5 µm |
| pocket 88: | $1 \times 10^{15}$-$1 \times 10^{17}$/cm$^3$ | 0.1-0.7 µm |

The concentrations and thicknesses may be different in other embodiments. For example, the dopant concentration of the bulk substrate 26 may vary considerably.

Various symmetrical and asymmetrical layouts may be used for the devices 20, 80 of FIGS. 1 and 2. For example, the gate structures may be U-shaped or arch-shaped (e.g., a single lateral connection) or toroidal or looped (e.g., two lateral connections) when viewed from above. In such cases, the source/body regions of the devices 20, 80 may nonetheless be considered central or centered despite the lack of symmetry in the other lateral dimension. The devices 20, 80 may thus be laterally symmetrical in zero, one or both lateral dimensions. The layouts of the above-described regions of the devices 20, 80 may vary considerably from these examples.

Figure 3:
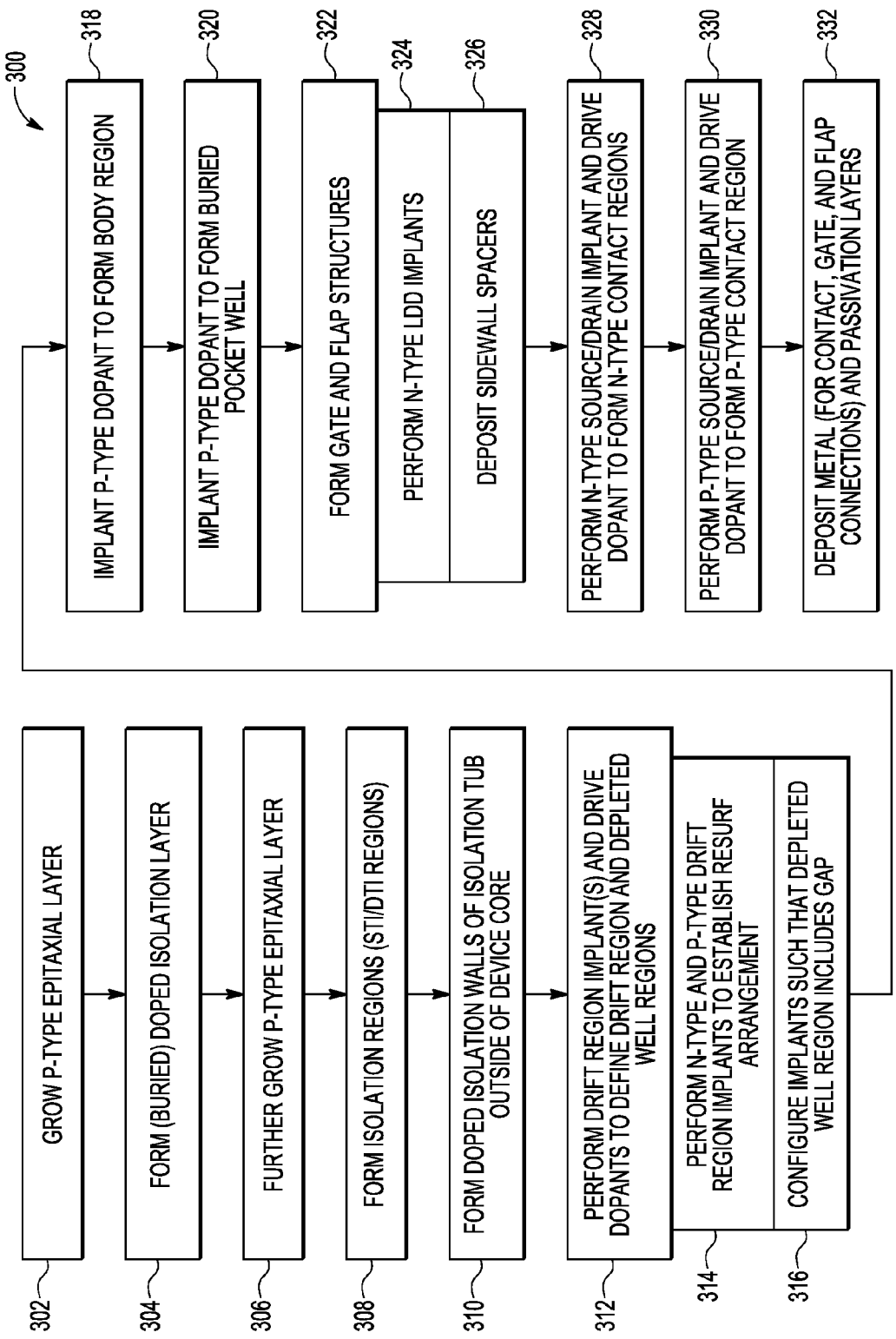
FIG. 3 is a flow diagram of an exemplary fabrication sequence to construct n-channel LDMOS transistors having seld-adjusted isolation bias in accordance with one embodiment.

FIG. 3 shows an exemplary method 300 for fabricating one or more of the above-described devices. In this example, the method 300 is configured to fabricate an n-channel device. The device may be an LDMOS device having a RESURF configuration and one or more of the above-described features directed to partially biasing a doped isolation barrier. The devices are fabricated with a p-type bulk semiconductor substrate, the regions or layers of which may have the conductivity types of the n-channel examples described above, or be alternatively fabricated with an n-type substrate. The method includes a sequence of acts, only the salient of which are depicted for convenience in illustration.

The ordering of the acts may vary in other embodiments. For example, an act directed to forming isolation wells may be implemented after one or more acts configured to form the regions located within a core device area.

The method 300 may begin with one or more acts directed to the growth or other formation of one or more epitaxial layers. In this example, a p-type epitaxial layer is grown on a p-type bulk substrate in an act 302. In some cases, e.g., where the p-type bulk substrate is lightly doped, the act 302 may be optional, e.g., in the interest of reducing process costs. During or after the formation of the epitaxial layer, a doped isolation layer is formed in an act 304. The act 304 may include a dopant implantation or other doping technique. In other cases, the isolation layer is formed before the growth of an epitaxial layer. In some cases, the method 300 then includes growth (e.g., further growth) of a p-type epitaxial layer in an act 306. As a result, the doped isolation layer becomes a buried doped isolation layer.

The lower biasing of the isolation regions of the device as described herein may allow the thickness of the epitaxial layer(s) to be minimized or reduced. The method 300 may accordingly include only a single epitaxial layer. In such cases, the act 304 may be implemented before or during formation of the single epitaxial layer.

In the example of FIG. 3, a number of STI regions and DTI structures are formed in an act 308. The STI regions may be used to define and separate active areas within and outside of the core device area. One or more STI regions may also be used to space a drain region from a gate structure in a field drift arrangement, as described above. The DTI structures may be ring-shaped to define a device area for the device. In some cases, the act 308 is implemented after implementation of one or more of the implantation procedures described below.

The STI regions and DTI structures may be formed via any now known or hereafter developed procedure. In some cases, the act 308 may include the formation of a trench and the deposition (e.g., chemical vapor deposition, or CVD) of one or more materials in the trench. In some embodiments, the trench is filled with silicon oxide. Additional or alternative materials may be deposited.

In an act 310, an implantation is performed to form a region of a doped isolation barrier. The region may be a well region disposed along a sidewall of the doped isolation barrier. The implantation may be configured to form one or more isolation wells, which may be vertically stacked upon one another to define the sidewall. The isolation wells may be positioned to extend upward from the buried doped isolation layer such that doped isolation barrier is shaped as an isolation tub. The isolation wells may be disposed at and along the DTI structure, as described above. The act 310 may be performed at various points in the fabrication procedure.

One or more dopant implantations are performed in an act 312 to form one or more well regions. A number of regions of the n-channel device may be formed. Each implantation may be configured to form a ring-shaped well region or multiple well regions. In some cases, the well region may perform multiple functions, as described above. For instance, the implantation of act 312 is configured such that well region has a portion configured as a drift region and a portion configured as a depleted well region disposed between a region (e.g., an isolation well region) of the doped isolation barrier and the drift region.

In the example of FIG. 3, the act 312 includes performing both n-type and p-type implantations in an act 314. The n-type implantation is configured to form a drift region and a depleted well region. The drift region and the depleted well region may be portions of a single well, as described above. The depleted well region is the portion of the single well disposed outside of the core device area. The depleted well region electrically couples the drift region and the doped isolation barrier to support the partial biasing of the doped isolation barrier, as described above.

The p-type implantation of the act 314 may be directed to forming the buried well region(s) used to deplete the drift region and the depleted well region. The p-type implantation may be configured such that the buried well region(s) are in contact with the drift region and the depleted well region. The buried well region adjacent the drift region acts as a RESURF region. In some cases, the n-type and p-type implantations of the act 314 use the same mask.

The n-type and p-type implantations of the act 314 may also include configuring the implantations in an act 316 such that the implanted areas of the depleted well regions (and the buried well regions in contact therewith) have interior gaps, as described above. The interior gaps are positioned to define an interior portion of the depleted well regions with a lower dopant concentration level for easier depletion. With the gaps, the n-type and p-type implantations of the act 314 may be configured to provide dopant throughout a well area of the well regions except an interior portion of the well area. The act 312 may then include driving the dopant of the third implantation via thermal diffusion into the interior portion such that the well region has a lower interior dopant concentration level for depletion thereof.

A number of p-type implantation procedures are performed. A p-type implantation procedure is performed in an act 318 to form the body region. In some cases, another p-type implantation procedure is performed to form a buried pocket well region in the depleted well region. The order in which these implantation procedures are implemented may vary from the order shown in FIG. 3.

The fabrication process may then include one or more procedures collectively shown in act 322. The procedures may be implemented in various orders. Additional or alternative procedures may be implemented. One or more components of gate and conductive flap structures may be initially formed. For instance, a gate dielectric layer and conductive plate may be deposited and patterned to form the gate and flap structures. A number of implantations may then be performed in an act 324 to form one or more LDD regions, e.g., adjacent the gate structure. After the dopant for the LDD regions is implanted, sidewall spacers may then be deposited along each gate structure in an act 326. The sidewall spacers and/or other components of the gate structure may then be used for self-alignment of a source region.

In acts 328 and 330, n-type and p-type source/drain implantations are performed to form the various n-type and p-type contact regions of the device, respectively. Source and drain regions may thus be formed. The p-type body contact region of the n-channel device is also formed.

A number of metal and passivation layers may then be deposited on the substrate in an act 332. The metal layers may be patterned to form Ohmic contacts and electrodes, and various interconnects, including interconnects to bias the conductive flap structure as described above.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Transistor devices having a controllable depletion region (e.g., depleted well region) are described above. The depletion region provides a soft electrical connection (rather than a hardwired connection) between the drain bias voltage and the isolation regions of the device. The voltage drop across the depletion region provides a self-adjusted differential potential for the isolation regions. The lower voltage on the isolation regions improves the vertical junction breakdown limit for the device by, for instance, relaxing the vertical electrical field stress within the core device area (e.g., under the device body). The RESURF effect (e.g., double RESURF effect) may thus be utilized to attain higher breakdown voltage levels (e.g., BVdss levels) without sacrifices in device size. For example, an increase in the thickness of the epitaxial layer(s) may be avoided as a result of the lower biasing of the isolation regions.

The depletion region may be disposed between the drift region and the isolation regions as a result of an outer drain/inner source arrangement. The arrangement eliminates the need to separate the device body from the isolation ring with, for instance, a lengthy section of the epitaxial layer in which the device regions are formed. The depletion region may be disposed along or within the device periphery for built-in DTI protection.

The depletion region may be a lightly doped region to enable depletion thereof. Depletion may be enhanced by a conductive flap structure (e.g., a polysilicon flap) supported by the substrate above the depletion region. Depletion may thus be facilitated from above the depletion region. The conductive flap structure may also shield the depletion region from other potentials present on metal layers routed above the depletion region.

Although described in connection with n-channel LDMOS transistors, the disclosed devices are not limited to any particular transistor configuration. The partial isolation biasing of the disclosed devices may be useful in a wide variety of power electronic devices. For instance, application of the features of the disclosed devices is not limited to LDMOS or other power MOS devices. The partial isolation biasing is also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1 and 2 may have a conductivity type (e.g., n-type or p-type) opposite to the type identified in the examples below.

In a first aspect, a device includes a semiconductor substrate, a doped isolation barrier disposed in the semiconductor substrate to isolate the device, a drain region disposed in the semiconductor substrate and to which a voltage is applied during operation, and a depleted well region disposed in the semiconductor substrate, and having a conductivity type in common with the doped isolation barrier and the drain region. The depleted well region is positioned between the doped isolation barrier and the drain region to electrically couple the doped isolation barrier and the drain region such that the doped isolation barrier is biased at a voltage level lower than the voltage applied to the drain region.

In a second aspect, a device includes a semiconductor substrate, a doped isolation barrier disposed in the semiconductor substrate, having a first conductivity type, and defining a device area, a body region disposed in the semiconductor substrate, having a second conductivity type, and in which a channel is formed during operation, a drift region disposed in the semiconductor substrate within the device area, having the first conductivity type, and through which charge carriers drift during operation after exiting the channel, a drain region disposed within the drift region, arranged within the device area outward of the body region, having the first conductivity type, and to which a voltage is applied during operation, and a depleted well region disposed in the semiconductor substrate and having the first conductivity type. The depleted well region is positioned between, and in contact with, the doped isolation barrier and the drift region to electrically couple the doped isolation barrier and the drain region such that a voltage drop across the depleted well region biases the doped isolation barrier at a voltage level lower than the voltage applied to the drain region.

In a third aspect, a method of fabricating a transistor includes performing a first implantation to form a region of a doped isolation barrier, the doped isolation barrier isolating the transistor, performing a second implantation to form a well region, and performing a third implantation to form a drain region to which a voltage is applied during operation. The first, second, and third implantations are configured to implant dopant of a common conductivity type. The second implantation is configured such that the well region electrically couples the doped isolation barrier and the drain region such that the doped isolation barrier is biased at a voltage level lower than the voltage applied to the drain region.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:
1. A device comprising:
a semiconductor substrate;
a doped isolation barrier disposed in the semiconductor substrate to isolate the device;
a drain region disposed in the semiconductor substrate and to which a voltage is applied during operation; and
a depleted well region disposed in the semiconductor substrate, and having a conductivity type in common with the doped isolation barrier and the drain region;
wherein the depleted well region is positioned between the doped isolation barrier and the drain region to electrically couple the doped isolation barrier and the drain region such that the doped isolation barrier is biased at a voltage level lower than the voltage applied to the drain region.

2. The device of claim 1, further comprising a body region disposed in the semiconductor substrate, and in which a channel is formed during operation, wherein the drain region surrounds the body region.

3. The device of claim 1, further comprising a conductive flap supported by the semiconductor substrate and positioned over the depleted well region, the conductive flap being biased during operation to deplete the depleted well region.

4. The device of claim 1, further comprising a drift region disposed in the semiconductor substrate, within which the drain region is disposed, and through which charge carriers drift during operation to reach the drain region, wherein the depleted well region is positioned between, and in contact with, the drift region and the doped isolation barrier.

5. The device of claim 4, wherein the drift region and the depleted well region constitute contiguous portions of a single well in the semiconductor substrate.

6. The device of claim 4, wherein the drift region has a dopant concentration profile in common with the depleted well region.

7. The device of claim 4, further comprising a buried well region disposed in the semiconductor substrate under and in contact with the drift region and the depleted well region, and having an opposite conductivity type than the drift region and the depleted well region to deplete the drift region and the depleted well region.

8. The device of claim 4, wherein:
the depleted well region comprises a pair of exterior sections adjacent the doped isolation barrier and the drift region, and an interior section disposed between the exterior sections; and
the interior section has a lower dopant concentration level than the pair of exterior sections.

9. The device of claim 1, wherein:
the doped isolation barrier comprises a ring-shaped well region and a buried isolation layer extending from the ring-shaped well region under the device area; and
the depleted well region is ring-shaped and disposed inward of, and in contact with, the ring-shaped well region.

10. The device of claim 1, further comprising a floating pocket well region disposed within the depleted well region and having an opposite conductivity type than the depleted well region.

11. A device comprising:
a semiconductor substrate;
a doped isolation barrier disposed in the semiconductor substrate, having a first conductivity type, and defining a device area;
a body region disposed in the semiconductor substrate, having a second conductivity type, and in which a channel is formed during operation;
a drift region disposed in the semiconductor substrate within the device area, having the first conductivity type, and through which charge carriers drift during operation after exiting the channel;
a drain region disposed within the drift region, arranged within the device area outward of the body region, having the first conductivity type, and to which a voltage is applied during operation; and
a depleted well region disposed in the semiconductor substrate and having the first conductivity type;
wherein the depleted well region is positioned between, and in contact with, the doped isolation barrier and the drift region to electrically couple the doped isolation barrier and the drain region such that a voltage drop across the depleted well region biases the doped isolation barrier at a voltage level lower than the voltage applied to the drain region.

12. The device of claim 11, wherein the drain region surrounds the body region.

13. The device of claim 11, further comprising a conductive flap supported by the semiconductor substrate and positioned over the depleted well region, the conductive flap being biased during operation to deplete the depleted well region.

14. The device of claim 11, wherein the drift region and the depleted well region constitute contiguous portions of a single well in the semiconductor substrate such that the drift region has a dopant concentration profile in common with the depleted well region.

15. The device of claim 11, wherein:
the depleted well region comprises a pair of exterior sections adjacent the doped isolation barrier and the drift region, and an interior section disposed between the exterior sections; and
the interior section has a lower dopant concentration level than the pair of exterior sections.

16. The device of claim 11, further comprising a floating pocket well region disposed within the depleted well region and having an opposite conductivity type than the depleted well region.

17. A method of fabricating a transistor, the method comprising:
performing a first implantation to form a region of a doped isolation barrier, the doped isolation barrier isolating the transistor;
performing a second implantation to form a well region; and
performing a third implantation to form a drain region to which a voltage is applied during operation, the first, second, and third implantations configured to implant dopant of a common conductivity type;
wherein the second implantation is configured such that the well region electrically couples the doped isolation barrier and the drain region such that the doped isolation barrier is biased at a voltage level lower than the voltage applied to the drain region.

18. The method of claim 17, wherein the second implantation is configured such that the well region has a first portion configured as a drift region through which charge carriers drift during operation to reach the drain region and a second portion disposed between the region of the doped isolation barrier and the drift region.

19. The method of claim 17, wherein:
the second implantation provides dopant throughout a well area of the well region except a portion of the well area;
performing the third implantation comprises driving the dopant of the second implantation via diffusion into the portion such that the well region has a lower interior dopant concentration level for depletion of the well region between the doped isolation barrier and the drain region.

20. The method of claim 17, further comprising performing a fourth implantation to form a pocket well region within the well region, the fourth implantation being configured such that the pocket well region and the well have different conductivity types.

* * * * *